(12) United States Patent  (10) Patent No.: US 7,702,293 B2
Ruha et al.  (45) Date of Patent: Apr. 20, 2010

(54) MULTI-MODE I/O CIRCUITRY SUPPORTING LOW INTERFERENCE SIGNALING SCHEMES FOR HIGH SPEED DIGITAL INTERFACES

(75) Inventors: Antti Ruha, Oulu (FI); Tarmo Ruotsalainen, Oulu (FI); Jussi-Pekka Tervaluoto, Oulu (FI)

(73) Assignee: Nokia Corporation, Espoo (FI)

( * ) Notice: Subject to any disclaimer, the term of this patent is extended or adjusted under 35 U.S.C. 154(b) by 1946 days.

(21) Appl. No.: 10/005,766

(22) Filed: Nov. 2, 2001

(65) Prior Publication Data

US 2003/0087671 A1    May 8, 2003

(51) Int. Cl.
H04B 1/44 (2006.01)
H03K 19/0175 (2006.01)

(52) U.S. Cl. .................. 455/78; 455/80; 455/333; 326/81; 326/83; 333/26; 333/246; 375/257

(58) Field of Classification Search .............. 455/557, 455/575, 590, 90, 73, 334, 337, 63, 296, 455/78, 80, 83, 550.1, 575.1, 90.3, 128–129, 455/333, 252.1, 253.1, 281–282, 287, 288, 455/289; 326/82–93, 26–28, 112, 119, 121; 343/876; 333/101–103, 25–26, 32, 246, 333/254; 327/108–112, 199–210, 387–388, 327/404; 375/244, 257–259, 295, 316
See application file for complete search history.

(56) References Cited

U.S. PATENT DOCUMENTS 5,371,424 A * 12/1994 Quigley et al. ............... 326/63
5,790,058 A * 8/1998 Burzio et al. ................ 341/101
5,832,370 A * 11/1998 Pena-Finol et al. ............. 455/73
5,929,655 A * 7/1999 Roe et al. ...................... 326/82
5,930,686 A * 7/1999 Devlin et al. .................. 455/84

(Continued)

Primary Examiner—Pablo N Tran
(74) Attorney, Agent, or Firm—Harrington & Smith

(57) ABSTRACT

A multi-mode I/O circuit or cell (10) is provided for transmitting and receiving data between ICs, where each IC contains at least one of the I/O circuits. Each data link includes transmitter circuitry (12) and receiver circuitry (14). The transmitter circuitry sends data to a receiver circuitry in another IC, and the receiver circuitry receives data from a transmitter circuitry in another IC. The I/O circuit is constructed with CMOS-based transistors (e.g., CMOS or BiCMOS) that are selectively interconnected together by a plurality of switches to operate as two single-ended, current or voltage mode links, or as a single differential current or voltage mode link. In the preferred embodiment the transmitter circuitry sends data to the receiver circuitry in another IC over a first pair of adjacently disposed conductors, and the receiver circuitry receives data from the transmitter circuitry in another IC over a second pair of adjacently disposed conductors. The transmitter circuitry and the receiver circuitry are selectively configured by the plurality of switches for operating in a double single-ended voltage mode link mode, a double single-ended current mode link mode, a mode defined by a single differential voltage mode link with a single-ended input drive, a mode defined by a single differential voltage mode link with a differential input drive, a mode defined by a single differential current mode link with a single-ended input drive mode, and a mode defined by a single differential current mode link with a differential input drive. A common I/O circuit may also be provided, and programmed into either the transmitter or the receiver circuit configuration.

40 Claims, 14 Drawing Sheets

U.S. PATENT DOCUMENTS

| | | | | |
|---|---|---|---|---|
| 5,966,032 A * | 10/1999 | Elrabaa et al. | | 326/84 |
| 5,994,921 A * | 11/1999 | Hedberg | | 326/81 |
| 6,009,314 A * | 12/1999 | Bjork et al. | | 455/83 |
| 6,031,394 A * | 2/2000 | Cranford et al. | | 326/81 |
| 6,243,776 B1 * | 6/2001 | Lattimore et al. | | 710/104 |
| 6,294,933 B1 * | 9/2001 | Chun et al. | | 326/86 |
| 6,295,323 B1 * | 9/2001 | Gabara | | 375/257 |
| 6,346,832 B1 * | 2/2002 | Young | | 327/108 |
| 6,377,666 B1 * | 4/2002 | Cheng et al. | | 379/93.06 |
| 6,395,323 B2 * | 5/2002 | Martinez-Serna Villagran et al. | | 426/549 |
| 6,424,177 B1 | 7/2002 | Hairapetian | | 326/86 |
| 6,472,904 B2 | 10/2002 | Andrews et al. | | 326/38 |
| 6,480,026 B2 | 11/2002 | Andrews et al. | | 326/39 |
| 6,566,911 B1 * | 5/2003 | Moyer | | 326/83 |
| 6,665,339 B1 * | 12/2003 | Adams et al. | | 375/238 |
| 6,751,187 B2 * | 6/2004 | Walton et al. | | 370/210 |
| 6,753,700 B2 * | 6/2004 | Hairapetian | | 326/86 |
| 6,759,905 B2 * | 7/2004 | Tomasini et al. | | 330/258 |
| 6,760,388 B2 * | 7/2004 | Ketchum et al. | | 375/295 |
| 6,760,882 B1 * | 7/2004 | Gesbert et al. | | 714/774 |
| 6,784,500 B2 * | 8/2004 | Lemkin | | 257/368 |
| 6,836,290 B1 * | 12/2004 | Chung et al. | | 348/294 |
| 6,859,503 B2 * | 2/2005 | Pautler et al. | | 375/299 |
| 6,873,210 B2 * | 3/2005 | Mulder et al. | | 330/258 |
| 6,911,860 B1 * | 6/2005 | Wang et al. | | 327/404 |
| 6,961,546 B1 * | 11/2005 | Rofougaran et al. | | 455/118 |
| 6,992,541 B2 * | 1/2006 | Wright et al. | | 333/26 |
| 7,072,389 B2 * | 7/2006 | Scott et al. | | 375/220 |
| 7,088,789 B2 * | 8/2006 | Cheng et al. | | 375/316 |
| 7,091,791 B1 * | 8/2006 | Terrovitis | | 330/301 |
| 7,127,003 B2 * | 10/2006 | Rajan et al. | | 375/286 |
| 2002/0003436 A1 | 1/2002 | Andrews et al. | | 326/40 |
| 2002/0165626 A1 * | 11/2002 | Hammons et al. | | 700/53 |
| 2002/0181390 A1 * | 12/2002 | Mody et al. | | 370/208 |

* cited by examiner

MULTI-MODE I/O CIRCUITRY SUPPORTING LOW INTERFERENCE SIGNALING SCHEMES FOR HIGH SPEED DIGITAL INTERFACES

TECHNICAL FIELD

These teachings relate generally to circuitry used in input/output (I/O) operations and, more specifically, relates to I/O circuitry for supporting high speed digital data paths between integrated circuits (ICs).

BACKGROUND

Modern telecommunications systems transmit, receive, store and retrieve ever increasing amounts of data. The transmission of information between ICs in complex systems requires that the signaling scheme and input-output (I/O) circuitry be capable of high speed operation, generate minimal disturbances (noise), be tolerant to interference, consume little power and occupy a minimum area on the IC. Furthermore, it would be highly desirable from a usability point of view that the I/O circuitry support different supply voltages in the transmitter and receiver and be capable of multi-mode operation so as to enhance both backward and forward compatibility with ICs of different generations that may use different signaling schemes.

Conventional I/O circuit cells typically support only one type of signal, for example single-ended CMOS signals, and the supply voltage of the transmitting cell must be the same as the supply voltage of the receiving cell, and vice versa. Some conventional I/O cells can be used as transmitters or receivers to support bi-directional signaling.

The most commonly used CMOS digital signaling techniques use single-ended voltage mode signals with rail-to-rail levels and fast edges. However, this approach is known to generate a significant amount of signal disturbance and interference with other circuitry, and tends to limit the maximum usable data rates and/or seriously affects the performance of the system. The generated disturbances are especially detrimental in radio-based communications systems, where received analog signals can be extremely weak.

One technique to reduce the generation of disturbance signals is to use analog signaling between ICs. This approach implies that both the transmitter and receiver ICs must contain analog circuitry, e.g., analog-to-digital converters (ADCs) and digital-to-analog converters (DACs). However, the incorporation of any analog circuitry into an otherwise digital IC is problematic as digital ICs are typically implemented using highly optimized digital processes. In these processes the analog properties of devices are often compromised. In addition, the maximum tolerable supply voltage of these deep sub-micron processes is decreasing, which makes the implementation of analog functions increasingly difficult. In addition, the variety of available analog devices is limited. For example, passive devices, such as resistors, are made available only through the use of expensive additional process steps. Furthermore, analog signaling and the associated analog circuitry (e.g., ADCs and DACs) in digital ICs may lead to a prohibitively large circuit area requirement, as well as to an unacceptable power consumption. Also, implementing analog or mixed signal circuitry on large digital ICs makes design and testing more difficult, time consuming and expensive, and therefore increases both risk and delay.

Moreover, the price per silicon area in deep sub-micron CMOS processes is increasing. As the area of analog circuitry does not scale down at the same rate as digital circuitry, the placement of analog circuitry on digital ICs becomes increasingly expensive.

From the above it can be appreciated that it is advantageous that large digital ICs contain only digital circuitry, and that RF, analog and mixed signal circuitry is preferably placed in a separate chip that is implemented using a more appropriate process technology. This being the case, it can further be appreciated that the signaling between ICs should be optimized instead, without relying on the use of analog-based I/O circuitry.

It is thus important to develop efficient inter-IC signaling circuitry that enables an optimum system partitioning to be achieved. Prior to this invention, this need has not been adequately addressed.

SUMMARY

The foregoing and other problems are overcome by methods and apparatus in accordance with embodiments of these teachings.

These teachings are directed to multi-mode I/O circuitry for supporting low interference signaling schemes and protocols for high speed digital interfaces between ICs. A presently preferred, but by no means limiting, application for the multi-mode I/O circuitry is in a mobile radio communications system. The disclosed multi-mode I/O circuitry supports single-ended and differential current mode, low swing voltage mode and CMOS signaling, and the operational mode of the disclosed receiver and transmitter circuits can be selected using just a few control bits. The I/O circuitry need only use standard MOS transistors and can therefore be implemented using any conventional CMOS or BiCMOS technology.

From an interference mitigation point of view the most preferred signaling technique employs differential current mode signaling. The disclosed I/O circuitry supports this preferred mode of operation, but both the receiver and transmitter circuitry may also be used with, for example, conventional CMOS level I/O circuitry. This is an important feature for achieving compatibility with existing and emerging systems. For example, an IC equipped with the disclosed receiver I/O circuitry may communicate with transmitting I/O circuitry of an other IC from a same or a different circuit generation using different signaling schemes and I/O circuitry. Similarly, an IC equipped with the disclosed transmitter I/O circuitry may communicate with the receiving I/O circuitry of another IC from the same or different circuit generation using different signaling schemes and I/O circuitry.

While the presently preferred differential signaling scheme, by definition, employs two wires per signal link, the requirement to provide the additional wiring is at least partially offset by the fact that such differential links can support higher data rates than non-differential, single conductor types of links.

These teachings provide a solution to the general problem of how to most effectively transmit increasing amounts of data between ICs, without compromising or deteriorating the performance of the system with the interference and noise associated with the operation of high speed digital data links, and without requiring that analog circuitry be integrated into the ICs.

These teachings overcome the following specific technical problems, as well as others. First, the differential current mode signaling enabled by the I/O circuitry exhibits less noise and interference than commonly used CMOS digital signaling using single-ended voltage mode signals with rail-to-rail levels and fast edges. Second, the low interference signaling technique in accordance with these teachings enables high speed digital signaling between ICs, and can be used to advantage in radio communications systems containing extremely weak analog signals. Relatedly, the use of these teachings facilitates the system design task by allowing a more optimum partitioning of the system functions between various ICs.

In accordance with an aspect of these teachings there is provided multi-mode I/O circuitry or cells for transmitting and receiving data between ICs, wherein each data link contains at least one of the disclosed I/O circuits. Each data link between ICs includes transmitter circuitry and receiver circuitry. The transmitter circuitry sends data to the receiver circuitry in another IC, and the receiver circuitry receives data from the transmitter circuitry in another IC. The disclosed I/O circuitry is preferably constructed with CMOS-based transistors (e.g., CMOS or BiCMOS) that are selectively interconnected together by a plurality of switches to operate as two single-ended, current or voltage mode links, or as a single differential current or voltage mode link. In the preferred embodiment the transmitter circuitry sends data to the receiver circuitry in another IC over a first pair of adjacently disposed conductors, and the receiver circuitry receives data from the transmitter circuitry in another IC over a second pair of adjacently disposed conductors.

Preferably, the transmitter circuitry and the receiver circuitry are selectively configured by at least some of the plurality of switches for operating under a condition where the power supply voltage of the transmitter circuitry is equal to the power supply voltage of the receiver circuitry in another IC, or for operating under a condition where the power supply voltage of the transmitter circuitry is less than the power supply voltage of the receiver circuitry in another IC, or for operating under a condition where the power supply voltage of the transmitter circuitry is greater than the power supply voltage of the receiver circuitry in another IC. These may be considered as various ones of double single-ended, CMOS voltage level link modes.

It is noted that a single-ended current mode link, as well as differential voltage and current mode links, all support different supply voltages in the transmitter and receiver ICs. However, as the single-ended voltage mode link presents the most difficult case, it is described in the greatest detail below.

More specifically, the transmitter circuitry and the receiver circuitry are selectively configured by the plurality of switches for operating in a double single-ended voltage mode link mode, a double single-ended current mode link mode, a mode defined by a single differential voltage mode link with a single-ended input drive, a mode defined by a single differential voltage mode link with a differential input drive, a mode defined by a single differential current mode link with a single-ended input drive mode, and a mode defined by a single differential current mode link with a differential input drive.

It is also within the scope of these teachings to provide additional switches in the disclosed I/O circuitry to convert between transmitter and receiver I/O circuitry.

Further in this regard, also disclosed is circuitry and a method for sending data between ICs. The method includes providing at least two ICs to each contain at least one instance of an I/O circuit constructed with CMOS-based transistors; programming the I/O circuit in a first IC to function as data transmitter circuitry and programming the I/O circuit in a second IC to function as data receiver circuitry that are interconnected through a plurality of electrical conductors disposed between the first and second ICs. The programming step includes programming the I/O circuits in both the first and second ICs to support two single-ended, current or voltage mode links, or to support a single differential current or voltage mode link. A next step sends data from the first IC to the second IC using the I/O circuits and the electrical conductors. During the operation of the first and second ICs the method may further include a step of reprogramming the I/O circuit in the first IC to function as the data receiver circuitry and reprogramming the I/O circuit in the second IC to function as the data transmitter circuitry. A half-duplex mode of operation is thus made possible, as well as other modes, such as providing bidirectional data signal paths between ICs.

The methods and circuitry can be used with advantage in a number of different types of equipment, including wireless communication devices and accessory devices for wireless communication devices, as well as for interfacing wireless communication devices to accessory devices.

BRIEF DESCRIPTION OF THE DRAWINGS

The above set forth and other features of these teachings are made more apparent in the ensuing Detailed Description of the Preferred Embodiments when read in conjunction with the attached Drawings, wherein.

DETAILED DESCRIPTION OF THE PREFERRED EMBODIMENTS

Figure 1:
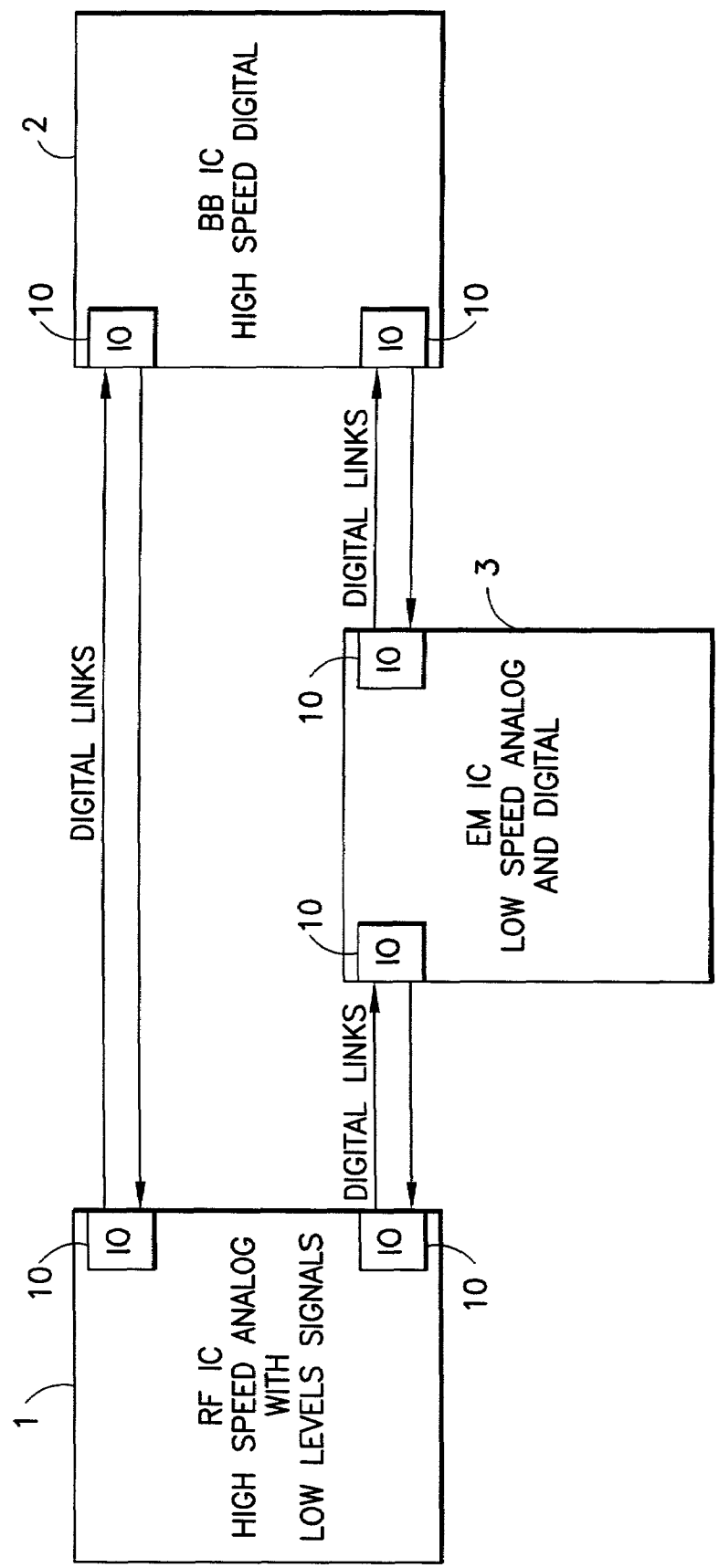
FIG. 1 shows a plurality of ICs of differing types and signaling requirements interconnected together by digital links made between I/O cells in accordance with these teachings.

FIG. 1 illustrates an example of a system containing several integrated circuits (ICs) 1, 2 and 3 with various signal types in a mobile communication terminal such as a cellular telephone or a personal communicator. Of most concern to these teachings is the signaling between the ICs 1, 2 and 3, and the associated parts of the I/O-cells 10 contained within each IC.

It is first noted that the I/O circuitry is referred to herein as well as the I/O cells 10. In general, data is transferred between the ICs through data links. In the transmitting end of a data link is disposed an I/O cell 10 containing the transmitter circuitry/cell, and in the receiving end is disposed an I/O cell 10 containing the receiver circuitry/cell. An I/O cell 10 may then be either a transmitter I/O cell or a receiver I/O cell. In a given system one IC could use either the transmitter I/O cells or the receiver I/O cells described herein, or it may contain both types of I/O cells, and other ICs could use different kinds of cells.

In the illustrated example, IC 1 is an RF IC containing high speed analog circuitry with low level signals, IC 2 is baseband (BB) IC characterized by high speed digital signals, and IC 3 is an energy management (EM) device employing mixed low speed analog and digital circuitry. The digital data communication links between the ICs 1, 2 and 3 originate and terminate at the I/O circuits or cells 10.

Figure 2:
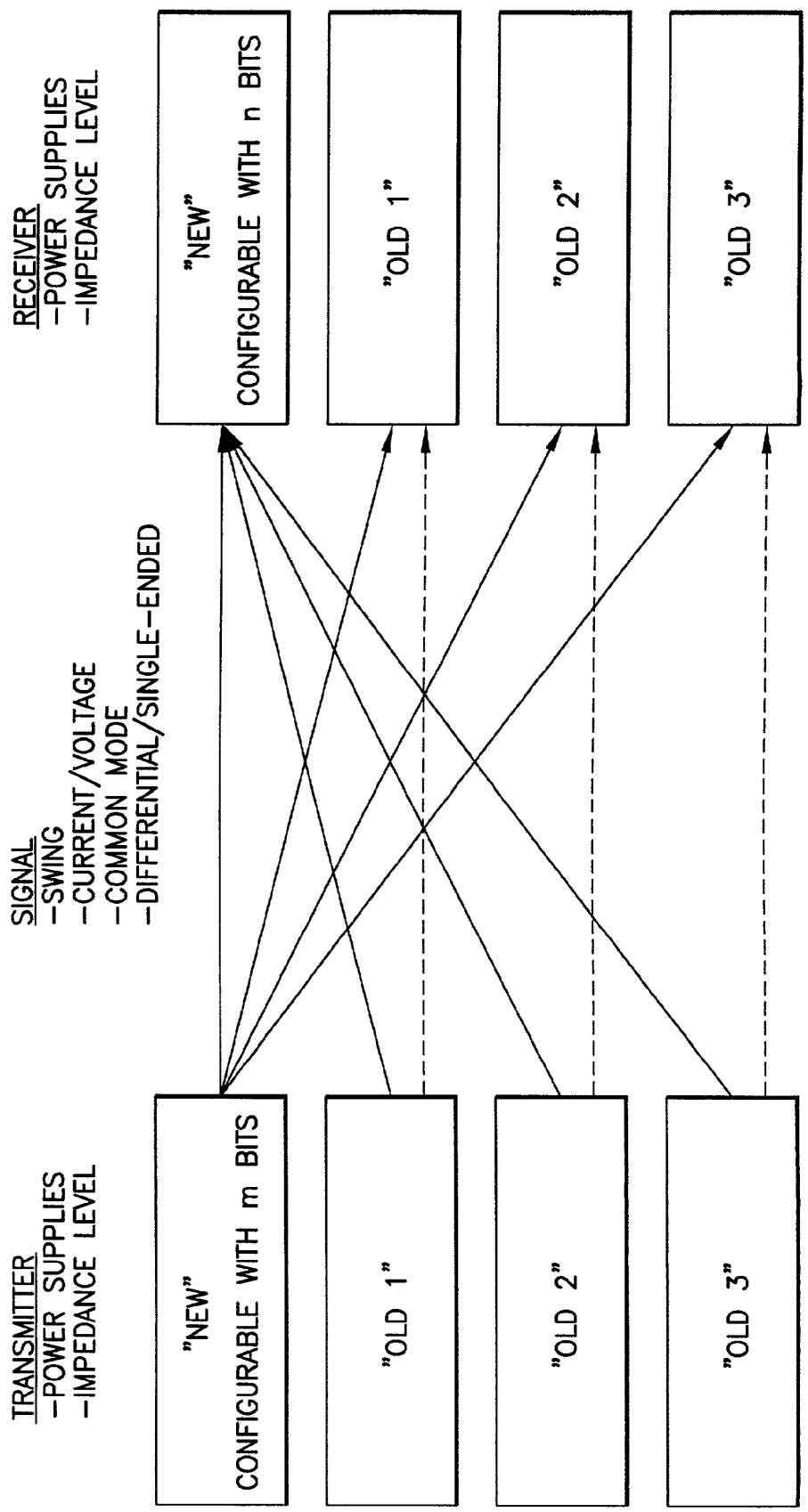
FIG. 2 illustrates how the use of these teachings provides compatibility between new and previous generations of ICs using different signaling schemes.

FIG. 2 is a diagram that visualizes the backward (and forward) compatibility requirement, which is a necessary precondition for new signaling schemes. In this Figure a "new" transmitter signaling technique is required to be compatible with a "new" receiver signaling technique, as well as with several versions of older receiver signaling techniques. In the same manner the "new" receiver signaling technique is required to be compatible with the "new" transmitter signaling technique, as well as with several versions or generations of older transmitter signaling techniques.

Figure 3:
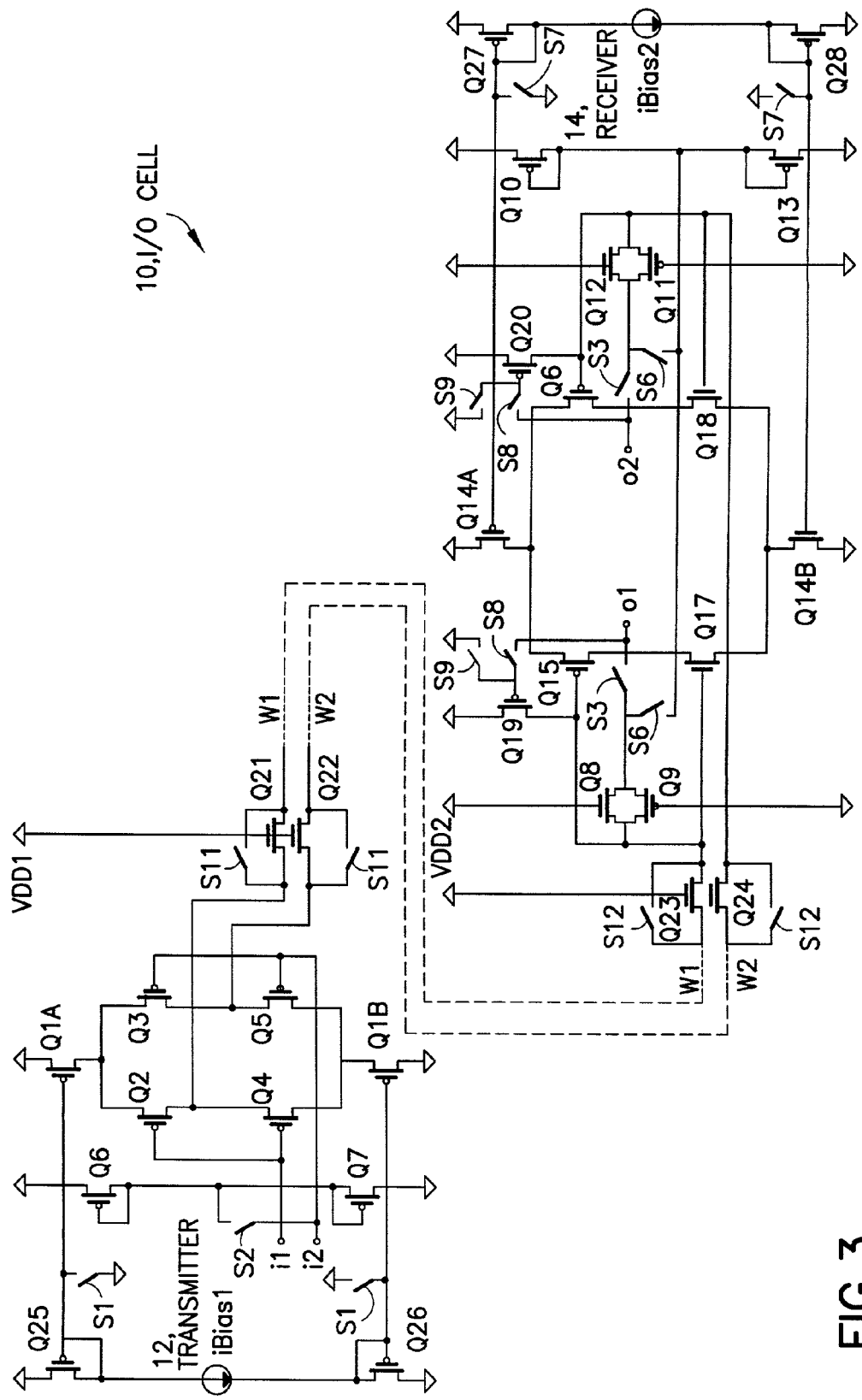
FIG. 3 is a schematic circuit diagram showing a presently preferred embodiment of the multi-mode I/O transmitter and receiver circuitry.

FIG. 3 illustrates the multi-mode I/O circuitry 10 in accordance with a presently preferred embodiment of these teachings. The embodiment of FIG. 3 provides an ability to realize the backwards and forwards compatibility shown in FIG. 2.

It is noted that typical supply voltages that may be used with the illustrated I/O circuits 10 could be, for example, 3.3 V, 2.5 V or 1.5 V. In low swing voltage mode signaling the voltage swing could be, for example, 0.5 V. VDD1 in FIG. 3 is the positive supply of the transmitter, VDD2 is the positive supply of the receiver, and ground is the negative supply of both the receiver and transmitter.

More particularly, FIG. 3 shows the disclosed I/O circuitry, one transmitter 12 and one receiver 14, which can form two single-ended links or one differential link. The various modes supported by the I/O circuitry are generally shown in FIGS. 5-13, while the differential current mode signaling technique is shown conceptually in FIG. 4.

Figure 4:
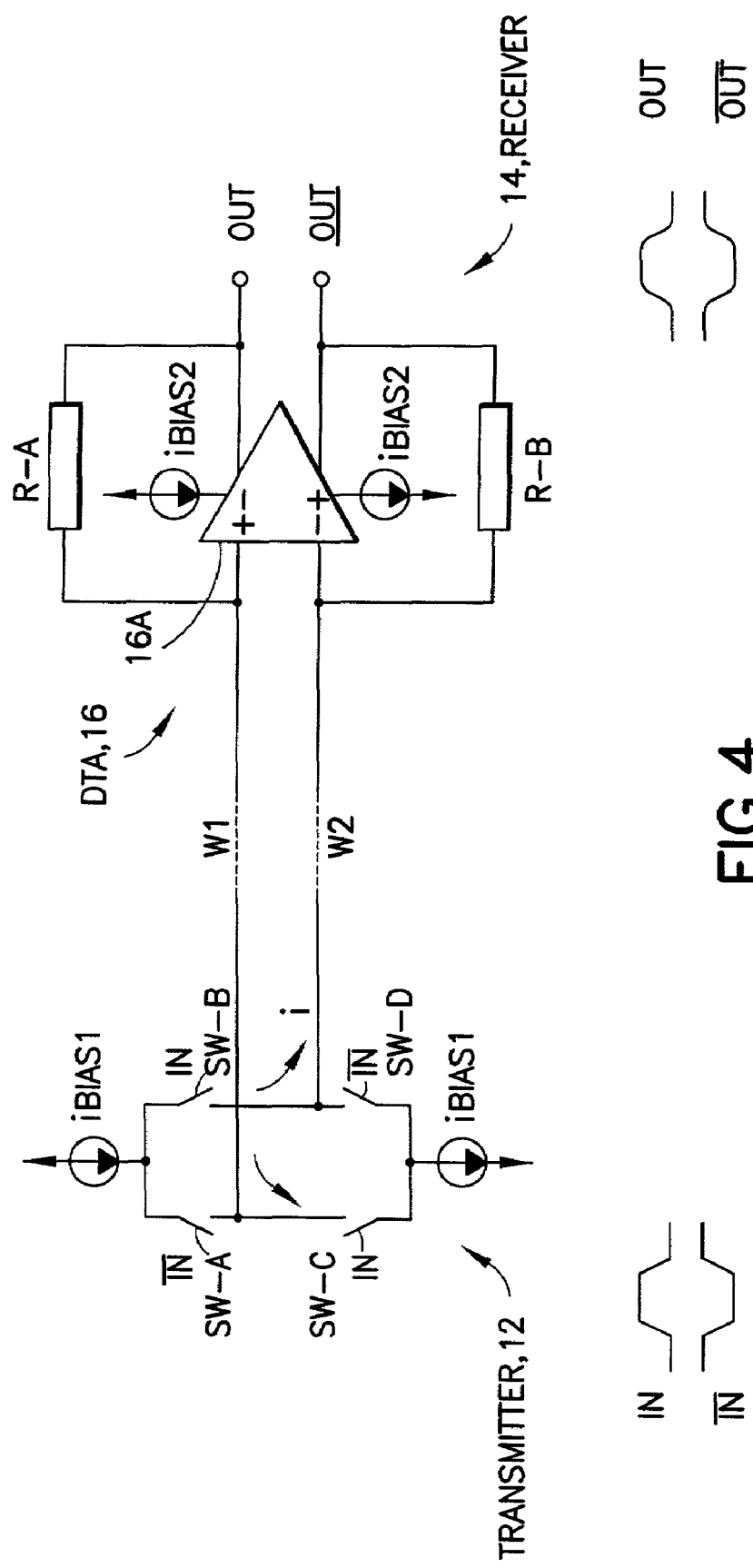
FIG. 4 is a block diagram of the multi-mode I/O transmitter and receiver circuitry of FIG. 3, and is useful in understanding the operation of the disclosed circuitry when implementing the preferred differential signaling technique.

With regard to the differential current mode signaling of FIG. 4, the transmitter 12 may be considered to be composed of two constant current sources (both referred to as ibias1) and a plurality of switches SW_A, SW_B, SW_C and SW_D. The signal link between ICs is implemented with two adjacently disposed wires w1 and w2. The receiver 14 includes a differential transimpedance amplifier (DTA) 16 biased with two constant current sources (both referred to as ibias2). Both of the transmitter and receiver circuits 12 and 14 may be constructed with standard MOS transistors, as shown in FIG. 3, and do not require the use of analog circuitry, or device types that are not generally compatible with standard CMOS processes, such as resistors.

In the conceptual view of FIG. 4 the input signal (in) and its inverse control the direction of the current flow in the signal wires w1 and w2 by controlling the four transistors that implement the switches SW_A through SW_D. The current from the constant current source ibias1 is steered from one branch to another using the switches SW_A through SW_D. In the signal wires w1 and w2 the currents have equal magnitudes but opposite directions, resulting in the magnetic fields around the wires cancelling one another within a short distance. Current spikes in the transmitter 12 are eliminated because of the constant current biasing, and "floating" output nodes can be provided by the action of the switches SW_A through SW_D. The receiving end determines the common mode, and the transmitter 12 and the receiver 14 can have the same or different power supply voltages. As will be described below with regard to FIGS. 6, 7 and 8, VDD1 can be equal to VDD2, or VDD1 can be less than VDD2 (within certain limits), or VDD1 can be greater than VDD2 (within certain limits).

The receiver 14 includes the differential transimpedance amplifier 16 that is constructed from an amplifier 16A and MOS feedback resistors R_A and R_B in a shunt-shunt configuration. The differential input current is converted to a differential output voltage by the DTA 16. The input impedance of the DTA 16 is low, so the signal swing in the input, and therefore also in the wiring w1 and w2 between the ICs, is small.

The illustrated I/O circuit 10 embodiment has a number of advantages, including the following. First, the current drawn from the power supplies in the transmitter 12 is constant, i.e., ibias1. The constant current is simply steered from one branch to another. In this manner the operation of transmitter 12 causes minimal disturbances in the power supply lines and substrate. A second advantage is that the current drawn from the power supplies in the receiver 14 is also constant, i.e., ibias2, and the receiver 14 also causes minimal disturbances in the power supply lines and substrate. A third advantage is that the differential signaling in the two adjacent wires w1 and w2 radiates little electromagnetic disturbance, and thus significantly reduces the possibility of causing interference into other circuitry, such as sensitive RF circuitry. As the signal swing in the wires w1 and w2 is small, the capacitive coupling to other wires or circuits is low, and as the electromagnetic fields around the differential wires w1 and w2 cancel one another within a short distance from the wires the inductive coupling from w1 and w2 to other wires or circuits is low as well. Another advantage is that externally generated disturbances mainly generate a common mode signal, as differential signals are only caused by mismatches. Another advantage is that the differential wiring w1 and w2 has a lower inductance (if properly routed) than the combination of one signal wire and a common return wire (often ground) owing to the mutual inductance. This reduces ringing in the signal lines and thereby improves the noise margin and reduces timing errors.

The I/O cells 10 may be implemented using relatively low quality MOS transistors, and other active or passive devices are not required. As such, the I/O cells 10 may be implemented in all analog, all digital or in mixed signal integrated circuits using well-characterized digital or analog CMOS or BiCMOS technologies.

The remaining Figures illustrate how various operational modes of the I/O circuitry 10 can be configured with switches to support a variety of signaling schemes.

Figure 5A:
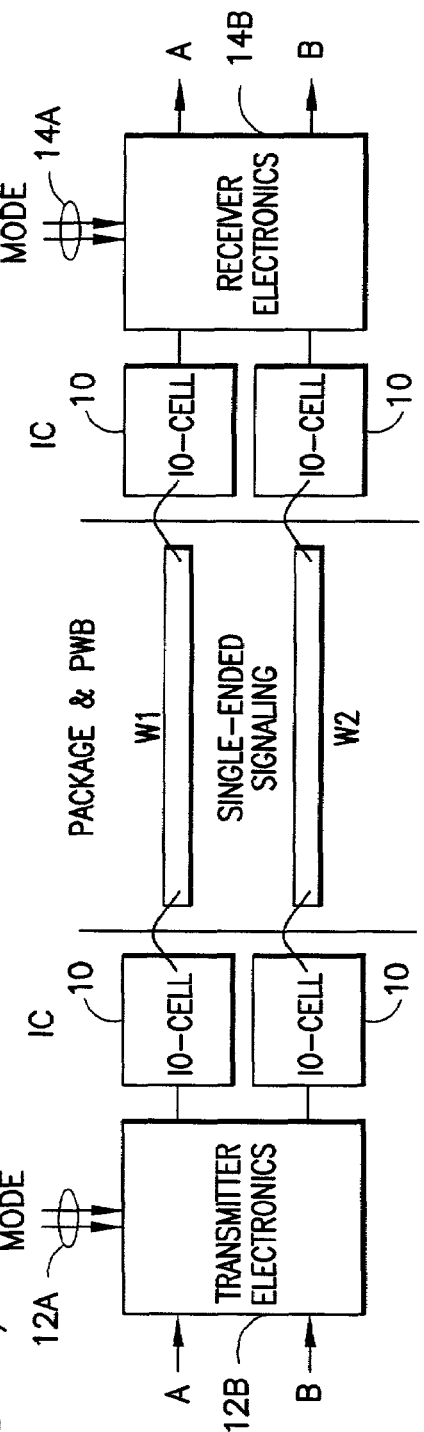
FIG. 5A shows the use of the multi-mode I/O circuitry in providing two single-ended (current or voltage mode) links, and is useful in understanding the Modes 1, 2, 3 and 4 depicted in FIGS. 6, 7, 8 and 9, respectively.
Figure 5B:
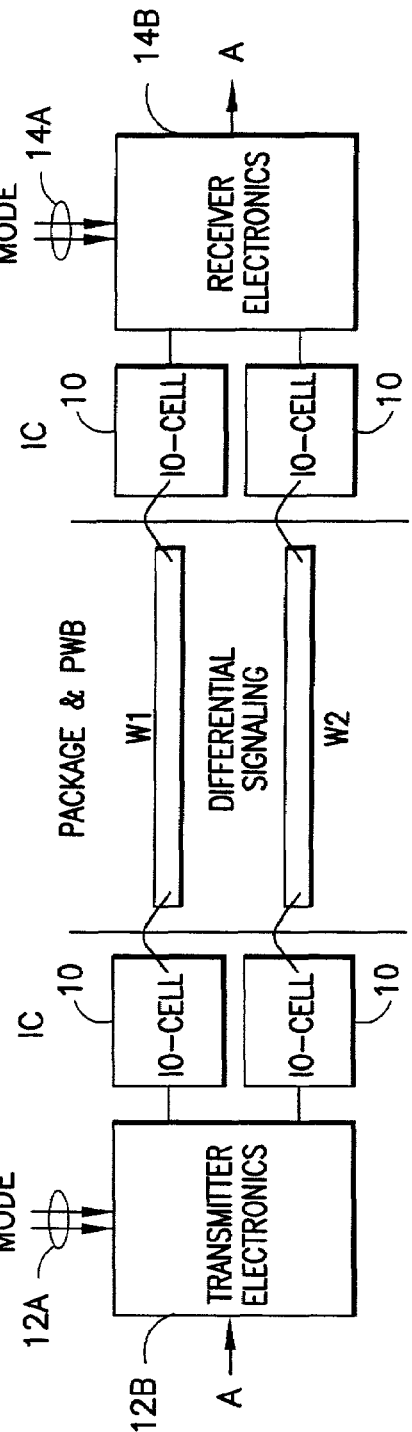
FIG. 5B shows the use of the multi-mode I/O circuitry in providing a single differential (current or voltage mode) links, and is useful in understanding the Modes 5, 6, 7 and 8 depicted in FIGS. 10, 11, 12 and 13.

FIGS. 5A and 5B, collectively referred to herein as FIG. 5, illustrate how the proposed circuitry can be used as two single-ended links or a single differential link, both in either current mode, low swing voltage mode or CMOS mode. More specifically, FIG. 5A shows the use of the multi-mode I/O circuitry 10 in providing two single-ended (current or voltage mode) links, and is useful in understanding the Modes 1, 2, 3 and 4 depicted in FIGS. 6, 7, 8 and 9, respectively, while FIG. 5B shows the use of the multi-mode I/O circuitry 10 in providing a single differential (current or voltage mode) link, and is useful in understanding the Modes 5, 6, 7 and 8 depicted in FIGS. 10, 11, 12 and 13.

FIG. 3 makes it evident that a plurality of switches are provided for setting the various modes of operation. The state of these switches is set by programming bits input over a plurality of transmitter Mode signal lines 12A and a plurality of receiver Mode signal lines 14A applied via corresponding transmitter electronics 12B and receiver electronics 14B (shown in FIG. 5). A description of these various switches is now provided with reference to FIG. 3.

Figure 6:
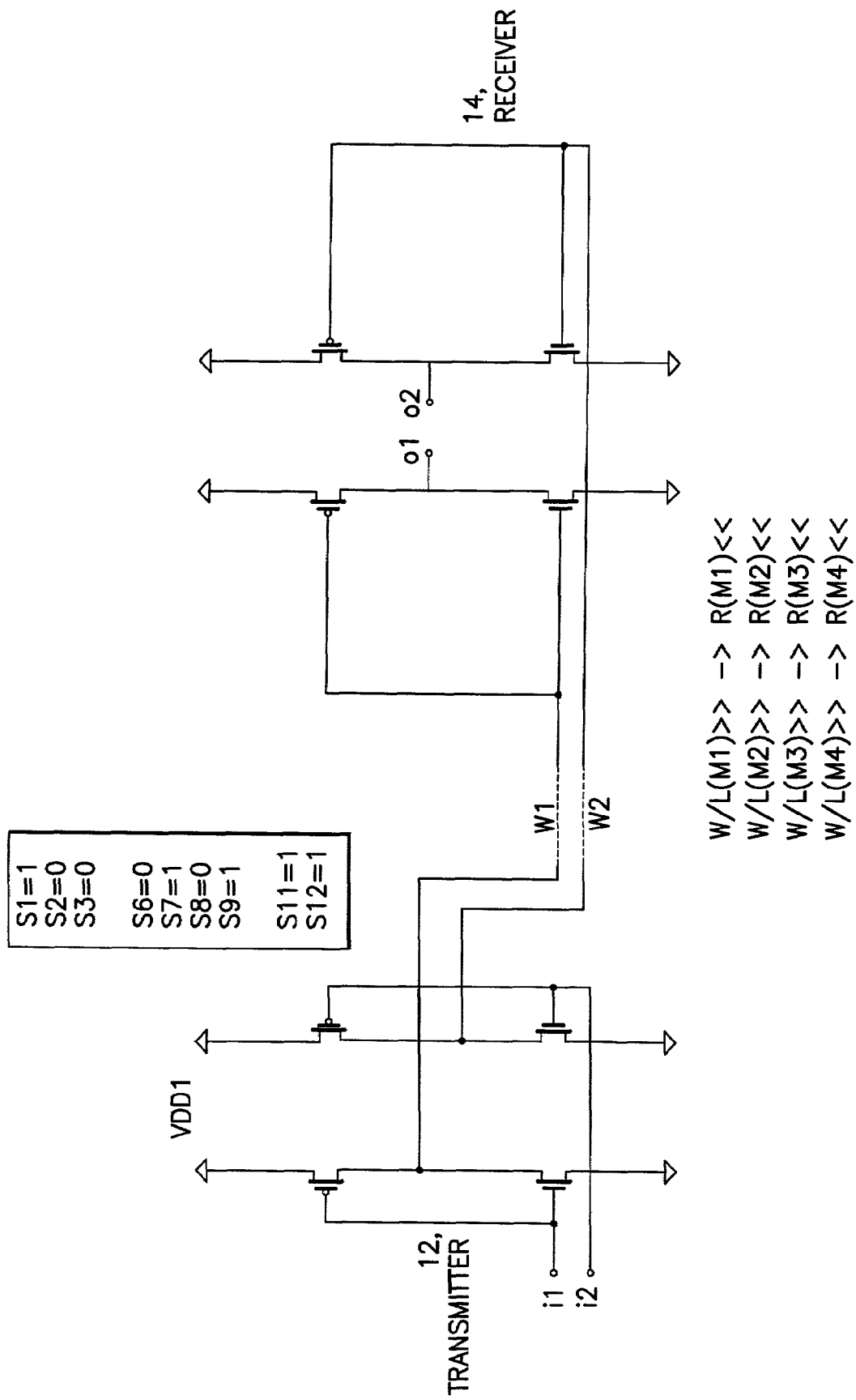
FIG. 6 includes a chart showing programmable switch settings for the switches shown in FIG. 3 for achieving two single-ended CMOS level links (where VDD1=VDD2), and a diagram of the resulting Mode 1 effective circuit.

S1: Transmitter switch S1 is used to connect the gate of the PMOS transistor Q1A in the tail of the transmitter differential pair formed by Q2 and Q3 to ground. Similarly, the second switch S1 is used to connect the gate of the NMOS transistor Q1B in the tail of the transmitter differential pair formed by Q4 and Q5 to VDD1. In this case Q1A and Q1B change from a current source to a small resistance, and the double differential pair is effectively transformed into two separate inverters, as shown in FIG. 6.

S2: Transmitter switch S2 is used to connect the input node i2 to a DC voltage having a magnitude approximately mid-way between the positive and negative power supplies. This voltage is set by Q6 and Q7 functioning as a voltage divider. In this case a single-ended input signal is enabled to drive the double differential pair Q2, Q3, Q4 and Q5, as shown for example in FIG. 10.

Figure 9:
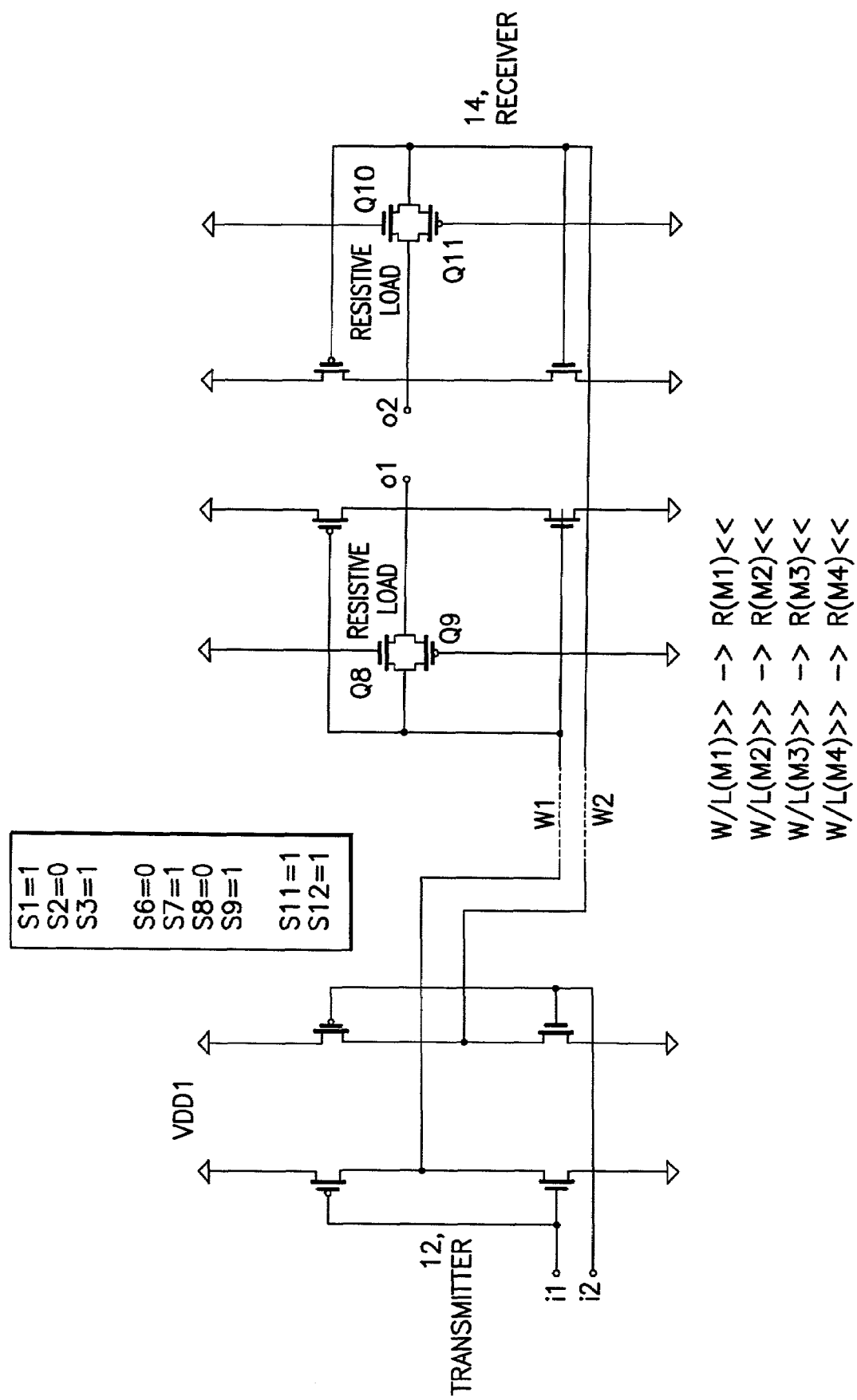
FIG. 9 includes a chart showing programmable switch settings for the switches shown in FIG. 3 for achieving two single-ended current mode links, and a diagram of the resulting Mode 4 effective circuit.

S3: Receiver switches S3 are used to connect a feedback resistance comprised of CMOS transmission gates Q8, Q9 and Q10, Q11, as shown in FIG. 9, between the inputs and outputs of the receiver 14. In this manner the receiver 14 is converted from a voltage amplifier to a transimpedance amplifier having a low input impedance and a low input signal swing.

S6: Receiver switches S6 are used to connect a resistor (the transmission gates formed by Q8, Q9 and Q10, Q11) to a DC voltage having a magnitude approximately mid-way between the positive and negative power supplies. This voltage is set by Q12 and Q13 functioning as a voltage divider. This reduces the input impedance and the signal swing at the input of the receiver 14.

S7: Receiver switch S7 is used to connect the gate of the PMOS transistor Q14A in the tail of the receiver differential pair formed by Q15 and Q16 to ground. Similarly, the second switch S7 is used to connect the gate of the NMOS transistor Q14B in the tail of the receiver differential pair formed by Q17 and Q18 to VDD2. In this case Q14A and Q14B change from a current source to a small resistance, and the double differential pair is effectively transformed into two separate inverters, as shown in FIG. 6.

S8: Receiver switches S8 are used to connect the gates of the PMOS transistors Q19 and Q20, that are connected between inputs of the receiver 14 and the positive power supply VDD2, to the outputs (O1 and O2) of the receiver 14 as shown by example in FIG. 7. In this case the PMOS transistors Q19 and Q20 function as regenerative loads and pull up the inputs of the receiver 14 to the positive supply VDD2.

S9: Receiver switches S9 are used to connect the gates of the PMOS transistors Q19 and Q20 to VDD2, as shown by example in FIG. 9. In this case the PMOS transistors Q19 and Q20 are shut off, and do not function as regenerative loads.

Figure 7:
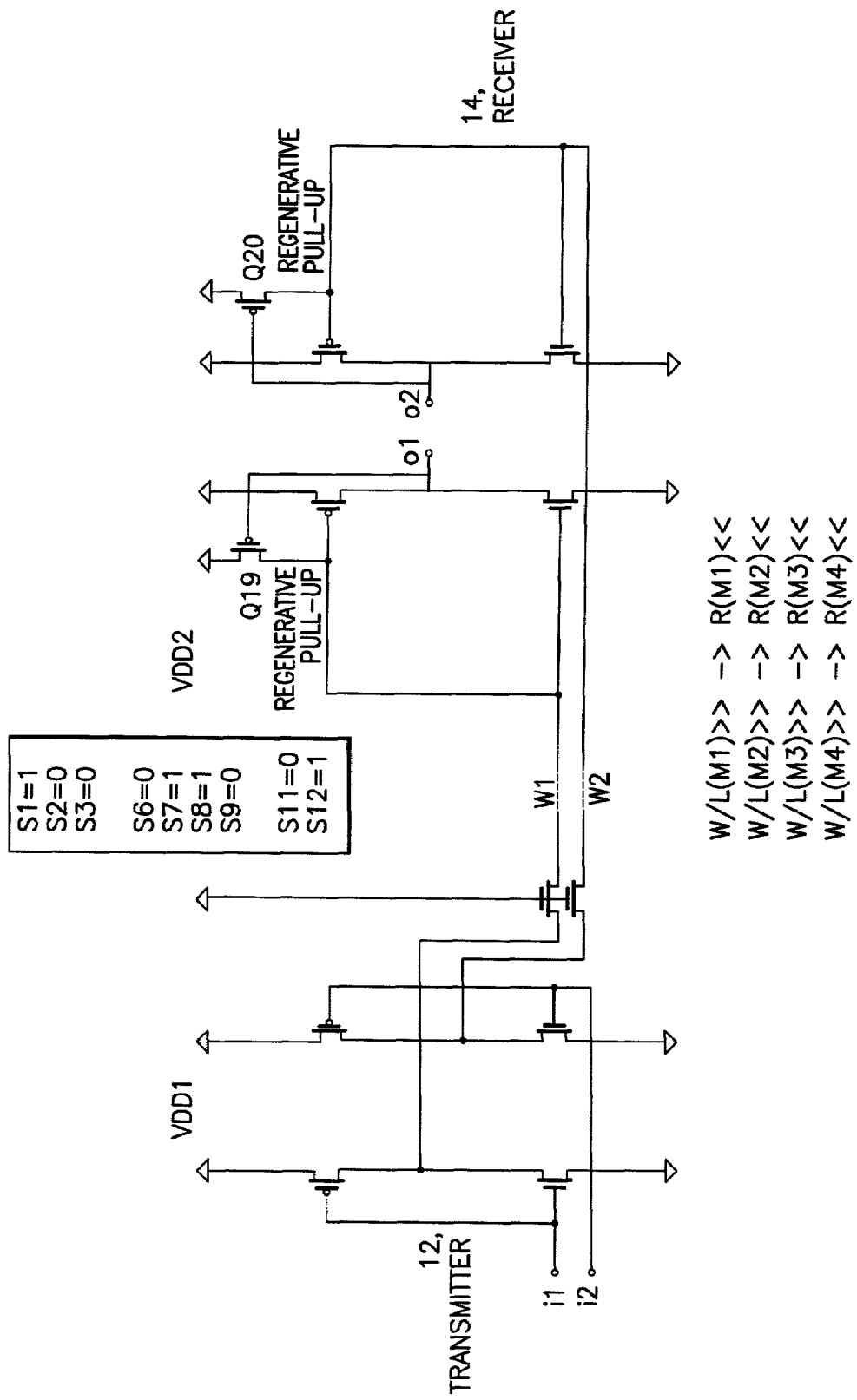
FIG. 7 includes a chart showing programmable switch settings for the switches shown in FIG. 3 for achieving two single-ended CMOS level links (where VDD1<VDD2), and a diagram of the resulting Mode 2 effective circuit.

S11: Transmitter switches S11 are used to bypass the NMOS transistors Q21 and Q22 that are in series with the outputs of the transmitter 12. The series NMOS transistors Q21 and Q22, when not bypassed, are used to protect the transistors of the transmitter 12 when the supply voltage of the receiver 14 is higher than the supply voltage of the transmitter 12, as shown in FIG. 7. If the supply voltages of the transmitter and receiver are the same, then the series NMOS transistors S11 can be bypassed by closing switches S11, as shown in FIG. 6.

Figure 8:
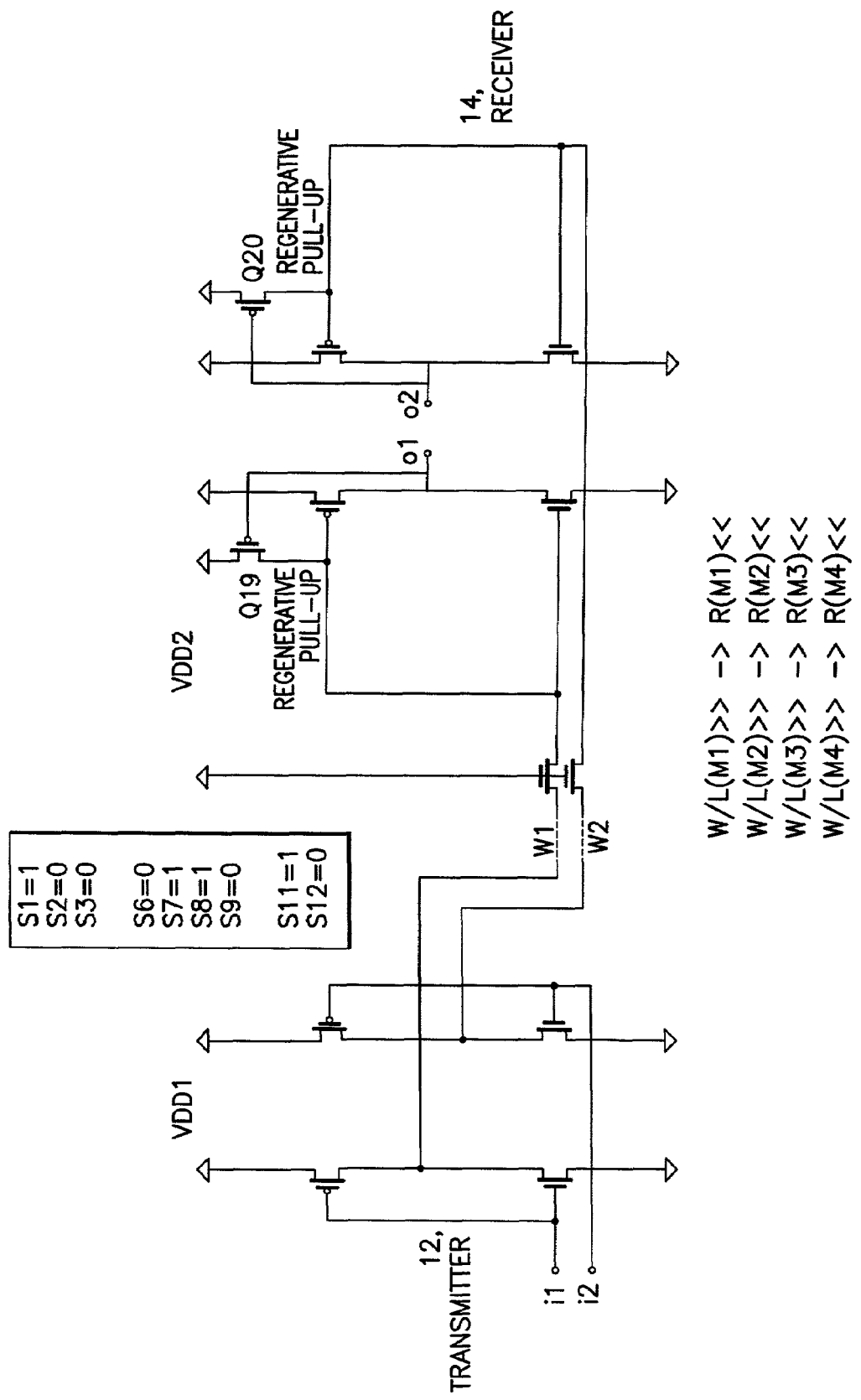
FIG. 8 includes a chart showing programmable switch settings for the switches shown in FIG. 3 for achieving two single-ended CMOS level links (where VDD1>VDD2), and a diagram of the resulting Mode 3 effective circuit.

S12: Receiver switches S12 are used to bypass the NMOS transistors Q23 and Q24 that are in series with the inputs of the receiver 14. The series NMOS transistors Q23 and Q24, when not bypassed, are used to protect the transistors of the receiver 14 when the supply voltage of the transmitter 12 is higher than the supply voltage of the receiver 14, as shown in FIG. 8. If the supply voltages of the transmitter 12 and receiver 14 are the same, then the series NMOS transistors S12 can be bypassed by closing switches S12, as shown in FIG. 6.

Transistors Q25, Q26, Q27 and Q28 are part of the current mirrors forming the constant current sources ibias1 and ibias2.

Figure 12:
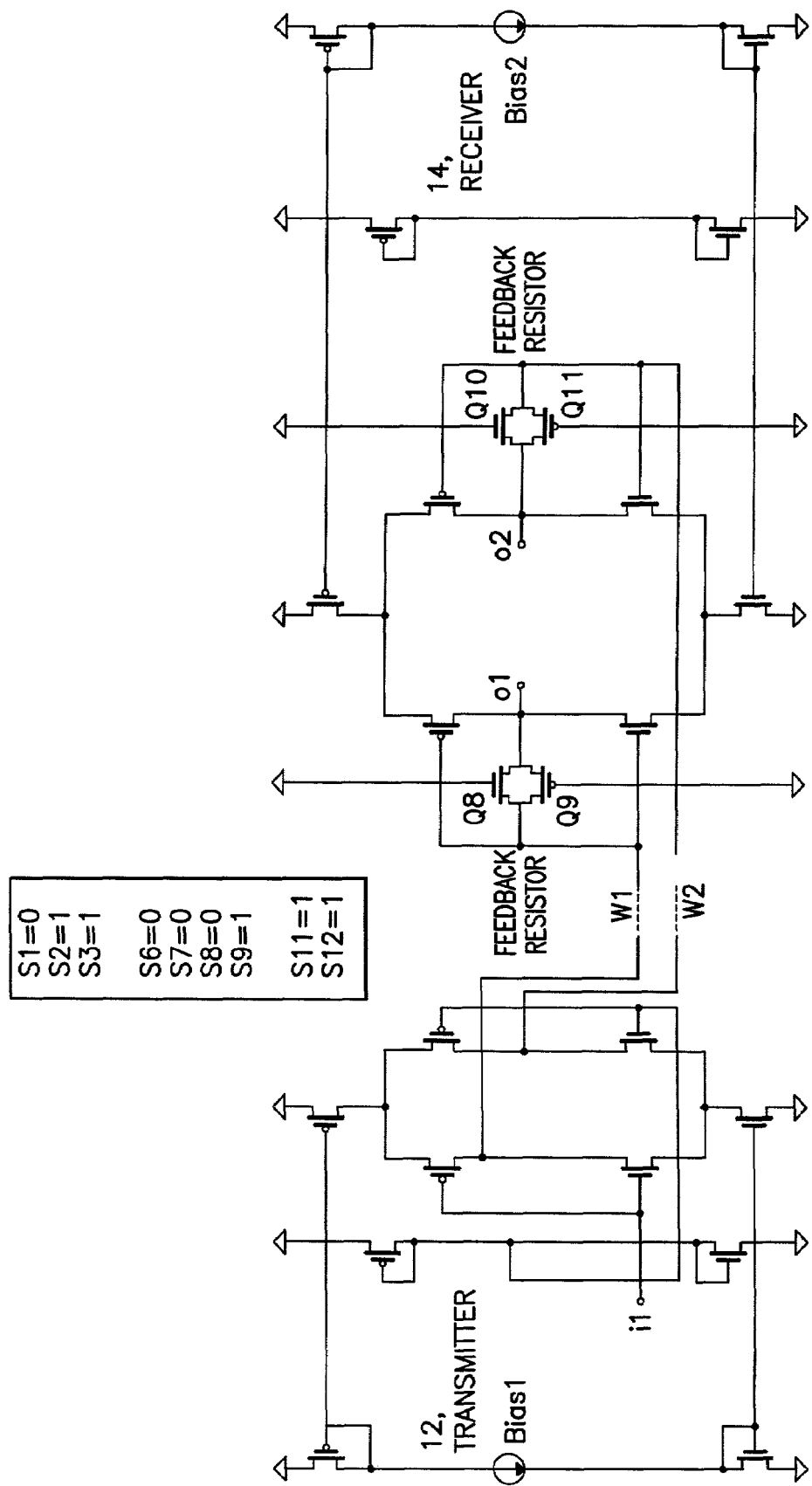
FIG. 12 includes a chart showing programmable switch settings for the switches shown in FIG. 3 for achieving a single differential current mode link, with a single-ended input drive, and a diagram of the resulting Mode 7 effective circuit.
Figure 13:
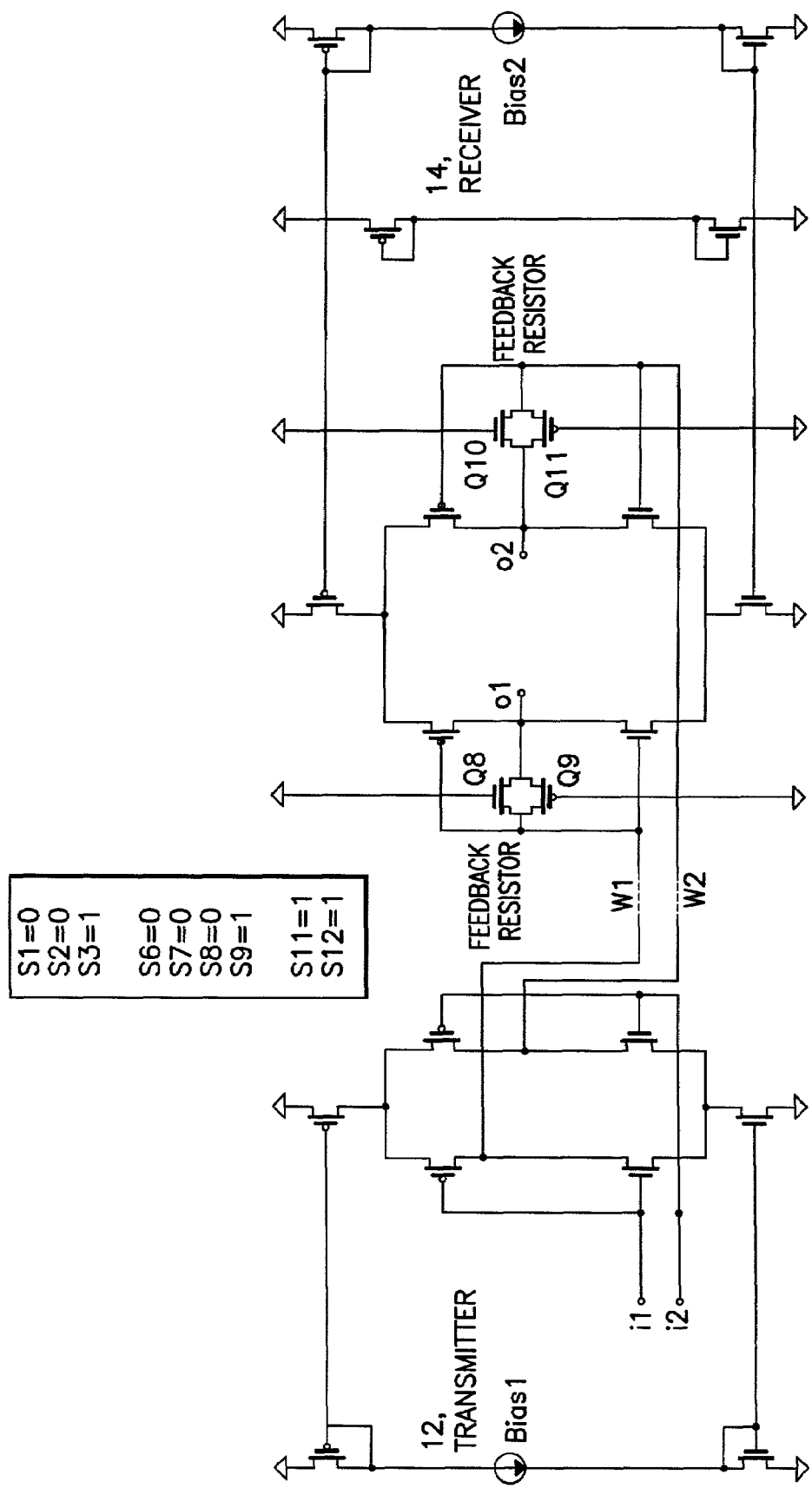
FIG. 13 includes a chart showing programmable switch settings for the switches shown in FIG. 3 for achieving a single differential current mode link, with a differential input drive, and a diagram of the resulting Mode 8 effective circuit.

By selectively setting the various switches shown in FIG. 3, as described in further detail below, the transmitter 12 may be used as a single differential transmitter, as shown for example in FIG. 10, or as two single-ended transmitters, as shown by example in FIG. 6. In the former case the transmitter input i2 is connected to a DC voltage with S2, and the input signal is connected to i1. In the latter case both i1 and i2 are used, and each is connected to a different input signal. While FIG. 4 is more conceptual in nature, FIGS. 12 and 13 show this mode of operation in more detail. In FIG. 12 the input is driven in the single-ended mode, while in FIG. 13 the input is driven differentially (symmetrically).

In the discussion of the following FIGS. 6-13 Sx=1 indicates that the switch is closed (conducting), while Sx=0 indicates that the switch is open (non-conducting). In a practical implementation the switches can be NMOS or PMOS transistors (or both in parallel), and are driven with appropriate control signals as is well known to those having skill in the art.

FIG. 6 includes a chart showing programmable switch settings for the switches shown in FIG. 3 for achieving two single-ended CMOS level (rail-to-rail swing) links (where VDD1=VDD2), and also shows a diagram of the resulting Mode 1 effective circuit. In this mode both the transmitter 12 and the receiver 14 can operate with conventional CMOS I/O cells.

Note that in FIGS. 6-9 W/L=Width/Length, i.e., the aspect ratio of a transistor: W/L(M1)=W/L(Q1A), W/L(M2)=W/L(Q1B), W/L(M3)=W/L(Q14A), W/L(M4)=W/L(Q14B). These relationships are shown by way of examples, and should not be viewed in a limiting sense upon the practice of these teachings.

FIG. 7 shows how the I/O circuitry 10 can be used to implement two single-ended CMOS level (rail-to-rail swing) signal links, when the supply of the transmitter is lower than that of the receiver. In this case the NMOS transistors Q21 and Q22 in series with the outputs of the transmitter 12 stop conducting before the output voltages reach the positive supply of the transmitter 12, and thus protect the output transistors of the transmitter. The voltages across the terminals of the protection NMOS transistors Q21 and Q22 are sufficiently low so that they are not damaged. The NMOS transistors Q21 and Q22 also prevent direct current flow between the positive supplies of the transmitter 12 and receiver 14 through the regenerative pull-up transistors Q19 and Q20. The regenerative pull-up using the weak transistors Q19 and Q20 is used in the receiver 14 to ensure sufficient signal level.

Another technique to deal with the difference in the supply voltages is to bring the lower supply voltage of the transmitter 12 to the receiver 14 using an additional wire, and to use this lower voltage in the I/O cells 10 of the receiver 14.

FIG. 8 shows the I/O circuitry 10 when the switches are set to implement two single-ended CMOS level (rail-to-rail swing) signal links, when the supply of the transmitter 12 is higher than that of the receiver 14. In this case the NMOS transistors Q23 and Q24 in series with the inputs to the receiver 14 stop conducting before the input voltages reach the positive supply of the receiver 14, and thus protect the input transistors of the receiver 14. The voltages across the terminals of the protection NMOS transistors Q23 and Q24 are sufficiently low so that no damage occurs. The NMOS transistors Q23 and Q24 also prevent direct current flow between the positive supplies of the transmitter 12 and the receiver 14 through the regenerative pull-up transistors Q19 and Q20.

As with the embodiment of FIG. 7, another technique to deal with the difference in the supply voltages would is to bring the lower supply voltage of the receiver 14 to the transmitter 12 using an additional conductor, and to use the lower voltage in the I/O cells 10 of the transmitter 12.

It should be noted that the single-ended current mode, as well as the differential voltage and current mode links, support different supply voltages in the transmitter and receiver ICs (within certain limits). These modes do not necessarily require any extra switches or transistors to perform this function. As the single-ended voltage mode link is the most difficult one to implement with different supply voltages at each end of the link, it is preferred to use the additional protection transistors Q21 to Q24, as well as the additional switches S11 and S12.

FIG. 9 illustrates the I/O circuitry 10 when the switches are set to implement two single-ended current mode signal links. The receiver 14 is configured as two transimpedance amplifiers, and the CMOS transmission gates Q8, Q9 and Q10, Q11 are used to implement the two feedback resistors.

Figure 10:
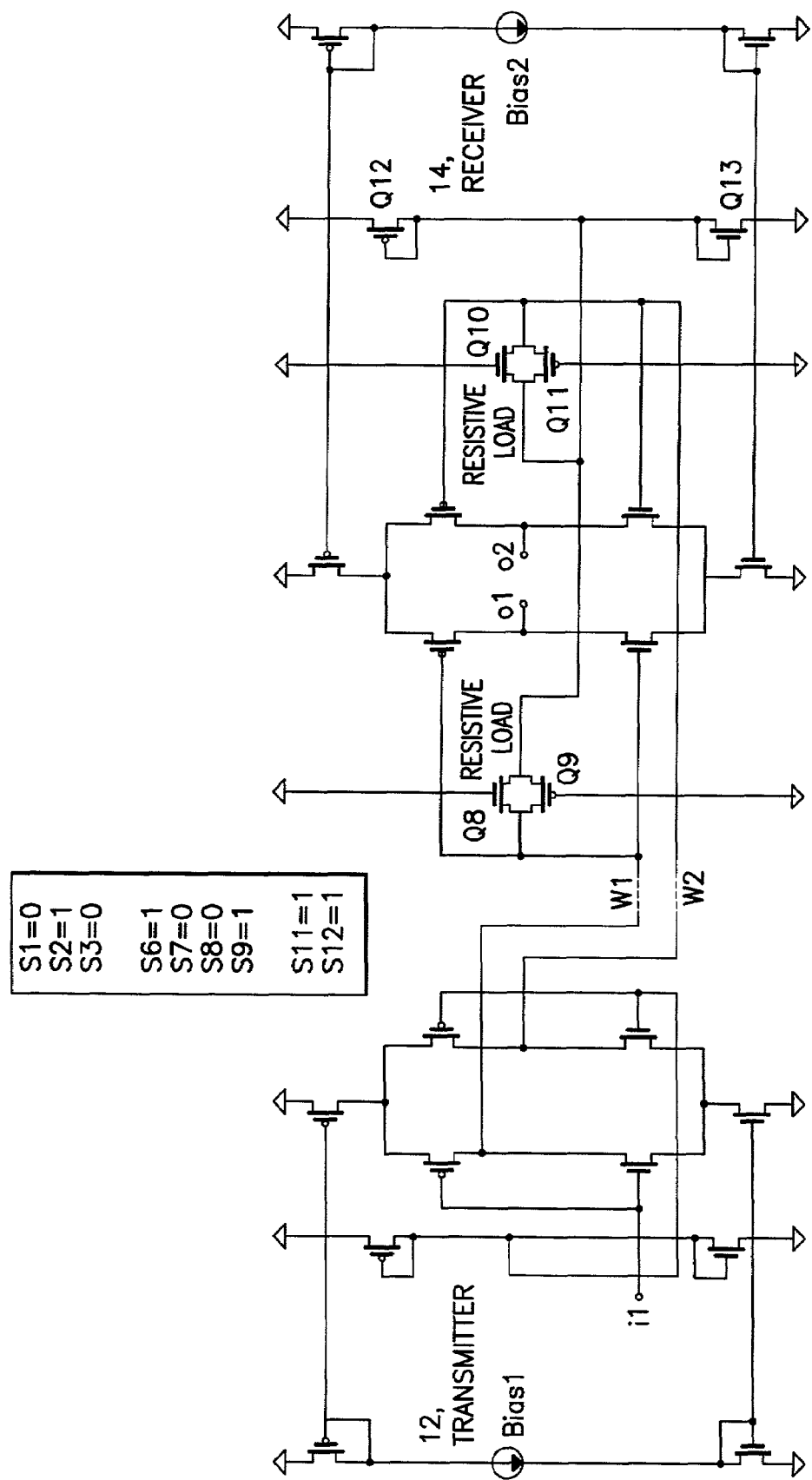
FIG. 10 includes a chart showing programmable switch settings for the switches shown in FIG. 3 for achieving a single differential low swing voltage mode link, with a single-ended input drive, and a diagram of the resulting Mode 5 effective circuit.

FIG. 10 illustrates the I/O circuitry 10 when the switches are set to implement a single differential low swing voltage mode signal link. In this mode (Mode 5) the input drive is single-ended, and the resistive loads (Q8, Q9 and Q10, Q11) are used in the receiver 14 to limit the signal swing. These resistive loads also set the input common mode voltage due to the connection through S6 to the DC voltage between Q12 and Q13.

Figure 11:
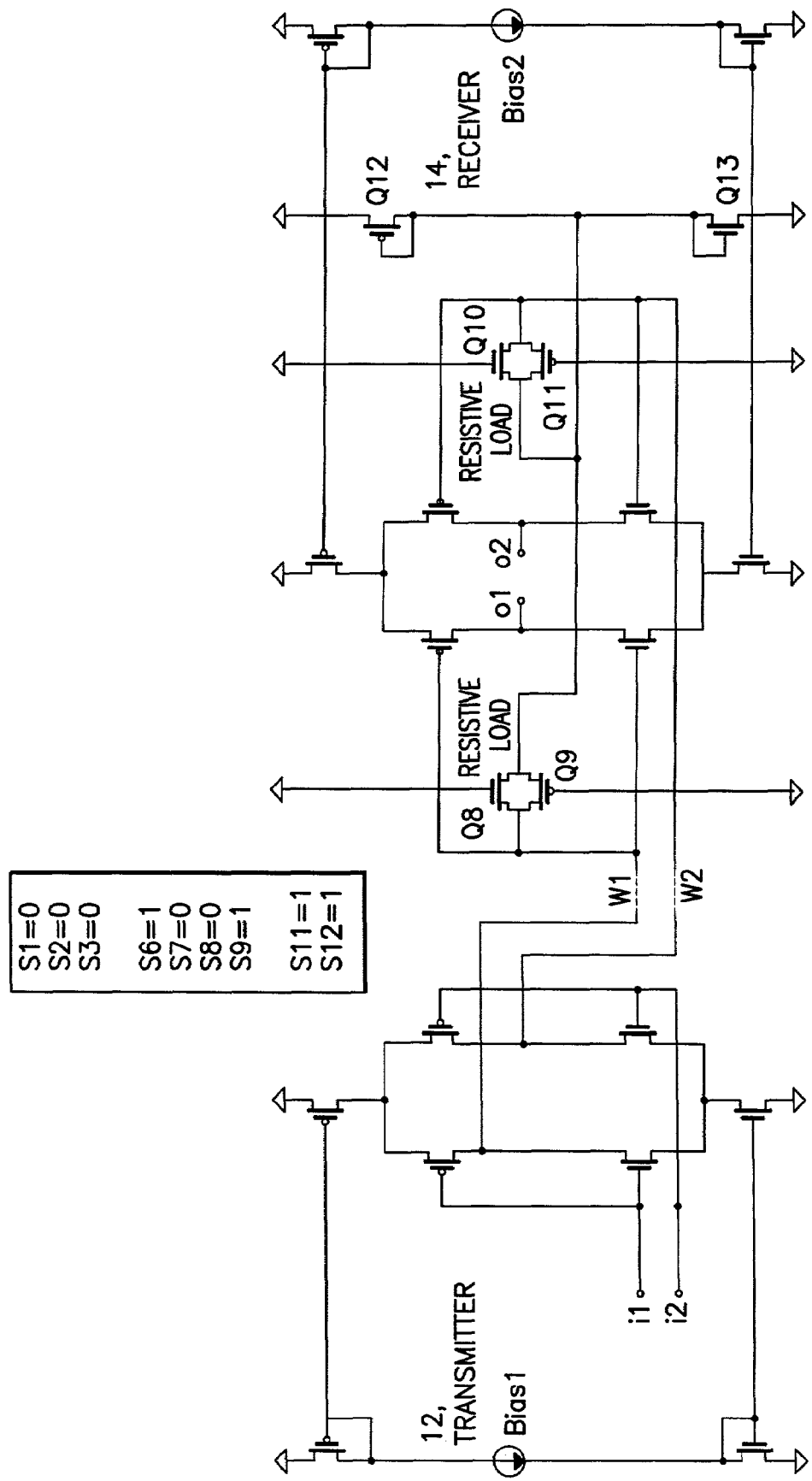
FIG. 11 includes a chart showing programmable switch settings for the switches shown in FIG. 3 for achieving a single differential low swing voltage mode link, with a differential input drive, and a diagram of the resulting Mode 6 effective circuit.

FIG. 11 illustrates the I/O circuitry 10 when the switches are set to implement a single differential low swing voltage mode signal link. The input drive is differential, and the resistive loads (Q8, Q9 and Q10, Q11) are used in the receiver 14 to limit the signal swing. As in the Mode 5 embodiment of FIG. 10, the resistive loads (Q8, Q9 and Q10, Q11) also set the input common mode voltage by the connection through S6 to the DC voltage between Q12 and Q13.

FIG. 12 illustrates the I/O circuitry 10 when the switches are set to implement a single differential current mode signal link. The input drive is single-ended, and the transistors Q15, Q16, Q17 and Q18 are configured as one transimpedance amplifier 16A (see FIG. 4). CMOS transmission gates Q8, Q9 and Q10, Q11 are used to implement the feedback resistors R_A and R_B, also as shown in FIG. 4.

FIG. 13 illustrates the I/O circuitry 10 when the switches are set to implement a single differential current mode signal link. In this mode (Mode 8) the input drive is differential. As in the embodiment of FIG. 12, the receiver 14 is configured as one transimpedance amplifier 16A, and the CMOS transmission gates Q8, Q9 and Q10, Q11 are used to implement the feedback resistors R_A and R_B.

This invention has thus described a technique for implementing a multi-mode I/O circuit that supports a number of different digital data transfer protocols. Known technologies (differential current mode and low swing voltage mode signaling) are combined into one group of devices that are selectively interconnected through the use of programmable switches. A desired operational mode may be selected through the use of mode bits. In this regard a few bits (e.g., two coded bits) could be input to a lookup table stored in a memory device, and a resulting decoded 3-bit output used to control the states of the three switches S1, S2, S11 contained in the transmitter 12 and similarly a few bits (e.g., three coded bits) could be input to a lookup table stored in a memory device, and a resulting decoded 6-bit output used to control the states of the six switches S3, S6, S7, S8, S9, S12 in the receiver 14 end of a given data link. In other embodiments these mode bits could be hardwired to predetermined logic levels to provide the desired mode of operation. In either case the use of the generic CMOS circuitry depicted in FIG. 3 provides a number of advantages over conventional approaches, such as the use of analog circuitry, as described above.

The resulting multi-mode operation is important in order to support compatibility between IC generations, and provides a backward and a forward compatible signal interface. The use of these teachings makes it more economical (smaller total silicon area) to implement multi-mode I/O structures, as compared to a combination of several different single mode I/O structures. These teachings also provide a universal CMOS-based I/O cell solution that requires no external components or integrated resistors.

While a number of switches and resulting modes have been described above, it should be realized that more or less than this number of switches or modes can be provided. For example, if one knows a priori that the power supply voltages of all system ICs will be the same, then one may choose to eliminate S11, S12 and Q21, Q22, Q23 and Q24, and provide a direct connection from the transmitter 12 to the receiver 14 via wires or conductors w1 and w2.

It should also be noted that both the transmitter I/O cell 12 and the receiver I/O cell 14 contain similar functional blocks, such as a double differential pair, biasing circuitry based on current mirrors, a reference voltage generator composed of a voltage divider and protection transistors in series with the I/O lines. Therefore, by adding a few additional switches the receiver circuitry could be transformed to the transmitter circuitry, and the transmitter circuitry transformed to the receiver circuitry, thus supporting bidirectional (half-duplex) links as well.

Figure 14:
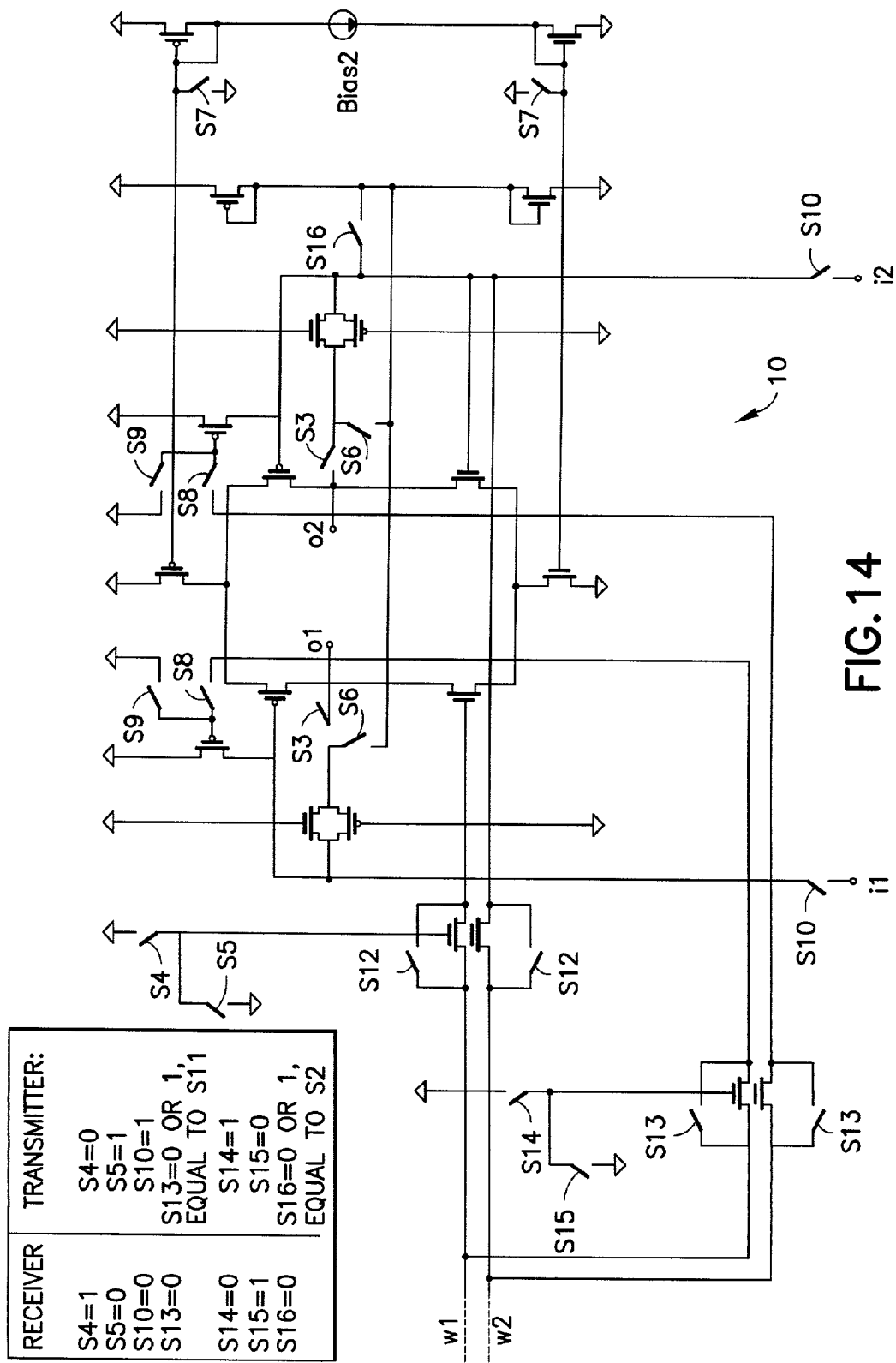
FIG. 14 includes a chart showing programmable switch settings for converting the I/O circuitry between a receiver I/O cell and a transmitter I/O cell.

Further in this regard, the chart shown in FIG. 14 specifies the settings for switches S4, S5, S10 and S13-S16 for an embodiment wherein the I/O circuitry 10 can be configured as a receiver I/O cell 14 or as a transmitter I/O cell 12. This embodiment is particularly attractive, as it generalizes and simplifies the IC circuit layout by using a common I/O circuit core. The disclosed switches could be hardwired, or they may be programmable (at power-up or initial configuration, and/or during operation).

The methods and circuitry disclosed herein can be used with advantage in a number of different types of equipment such as, but certainly not limited to, wireless communication devices such as cellular telephones and personal communicators, and in accessory devices for wireless communication devices. These circuits and methods can also be used for interfacing wireless communication devices to accessory devices.

Thus, while these teachings have been particularly shown and described with respect to preferred embodiments thereof, it will be understood by those skilled in the art that changes in form and details may be made therein without departing from the scope and spirit of these teachings.

What is claimed is:

1. A multi-mode input/output (I/O) circuit, comprising at least one of transmitter circuitry or receiver circuitry, said transmitter circuitry configured to send data to another integrated circuit, and said receiver circuitry configured to receive data from another integrated circuit, said input/output circuit being constructed with complementary metal-oxide-semiconductor based transistors that are selectively interconnected together by switches to operate as two single-ended, current or voltage mode links, and as a single differential current or voltage mode link.

2. The multi-mode input/output circuit as in claim 1, wherein said transmitter circuitry is configured to send data to receiver circuitry in another integrated circuit over a first conductor of a pair of adjacently disposed conductors, and where said receiver circuitry is configured to receive data from transmitter circuitry in another integrated circuit over a second conductor of the pair of adjacently disposed conductors.

3. The multi-mode input/output circuit as in claim 1, wherein said transmitter circuitry and said receiver circuitry are selectively configured by opening or closing switches for operating under a condition where a power supply voltage of said transmitter circuitry is equal to a power supply voltage of receiver circuitry in another integrated circuit, for operating under a condition where the power supply voltage of said transmitter circuitry is less than the power supply voltage of receiver circuitry in another integrated circuit, and for operating under a condition where the power supply voltage of said transmitter circuitry is greater than the power supply voltage of receiver circuitry in another integrated circuit.

4. The multi-mode input/output circuit as in claim 1, wherein said transmitter circuitry and said receiver circuitry are selectively configured by opening or closing switches for operating in one of a plurality of double single-ended, complementary metal-oxide-semiconductor voltage level link modes, wherein in a first mode a power supply voltage of said transmitter circuitry is equal to a power supply voltage of receiver circuitry in another integrated circuit, wherein in a second mode the power supply voltage of said transmitter circuitry is less than the power supply voltage of receiver circuitry in another integrated circuit, and wherein in a third mode the power supply voltage of said transmitter circuitry is greater than the power supply voltage of receiver circuitry in another integrated circuit.

5. The multi-mode input/output circuit as in claim 1, wherein said transmitter circuitry and said receiver circuitry are selectively configured by opening or closing switches for operating in one of said plurality of double single-ended, complementary metal-oxide-semiconductor voltage level link modes, or in said differential voltage or current mode links, and wherein the ICs at each end of the link may operate with different supply voltages.

6. The multi-mode input/output circuit as in claim 1, wherein said transmitter circuitry and said receiver circuitry are selectively configured by opening or closing switches for operating in a double single-ended voltage mode link mode.

7. The multi-mode input/output circuit as in claim 1, wherein said transmitter circuitry and said receiver circuitry are selectively configured by opening or closing switches for operating in a double single-ended current mode link mode.

8. The multi-mode input/output circuit as in claim 1, wherein said transmitter circuitry and said receiver circuitry are selectively configured by opening or closing switches for operating in a mode defined by a single differential voltage mode link with a single-ended input drive.

9. The multi-mode input/output circuit as in claim 1, wherein said transmitter circuitry and said receiver circuitry are selectively configured by opening or closing switches for operating in a mode defined by a single differential voltage mode link with a differential input drive.

10. The multi-mode input/output circuit as in claim 1, wherein said transmitter circuitry and said receiver circuitry are selectively configured by opening or closing switches for operating in a mode defined by a single differential current mode link with a single-ended input drive mode.

11. The multi-mode input/output circuit as in claim 1, wherein said transmitter circuitry and said receiver circuitry are selectively configured by opening or closing switches for operating in a mode defined by single differential current mode link with a differential input drive.

12. The multi-mode input/output circuit as in claim 1, wherein certain switches are provided to convert said input/output circuitry into either said transmitter circuitry configuration or into said receiver circuitry configuration.

13. The multi-mode input/output circuit according to claim 1, where in the single differential current mode a current drawn from said at least one of transmitter circuitry or receiver circuitry is constant.

14. A method comprising:
providing at least two integrated circuits to each contain at least one input/output circuit, said input/output circuit comprising at least one of transmitter circuitry or receiver circuitry, the transmitter circuitry configured to send data to another integrated circuit, and the receiver circuitry configured to receive data from integrated circuit, the input/output circuit being constructed with complementary metal-oxide-semiconductor based transistors; and selectively interconnecting together the complementary metal-oxide-semiconductor based transistors with switches to operate as two single-ended, current or voltage mode links, and as a single differential current or voltage mode link.

15. The method as in claim 14, wherein said transmitter circuitry sends data to receiver circuitry in another integrated circuit over a first conductor of a pair of adjacently disposed conductors, and where said receiver circuitry receives data from transmitter circuitry in said another integrated circuit over a second conductor of the pair of adjacently disposed conductors.

16. The method as in claim 14, wherein said transmitter circuitry and said receiver circuitry are selectively configured by opening or closing switches for operating under a condition where a power supply voltage of said transmitter circuitry is equal to a power supply voltage of receiver circuitry in another integrated circuit, for operating under a condition where the power supply voltage of said transmitter circuitry is less than the power supply voltage of receiver circuitry in another integrated circuit, and for operating under a condition where the power supply voltage of said transmitter circuitry is greater than the power supply voltage of receiver circuitry in another integrated circuit.

17. The method as in claim 14, wherein said transmitter circuitry and said receiver circuitry are selectively configured by opening or closing switches for operating in one of a plurality of double single-ended, complementary metal-oxide-semiconductor voltage level link modes, wherein in a first mode a power supply voltage of said transmitter circuitry is equal to a power supply voltage of said receiver circuitry in another integrated circuit, wherein in a second mode the power supply voltage of said transmitter circuitry is less than the power supply voltage of receiver circuitry in another integrated circuit, and wherein in a third mode the power supply voltage of said transmitter circuitry is greater than the power supply voltage of receiver circuitry in another integrated circuit.

18. The method as in claim 14, wherein said transmitter circuitry and said receiver circuitry are selectively configured by opening or closing the switches for operating in a double single-ended voltage mode link mode.

19. The method as in claim 14, wherein said transmitter circuitry and said receiver circuitry are selectively configured by opening or closing the switches for operating in a double single-ended current mode link mode.

20. The method as in claim 14, wherein said transmitter circuitry and said receiver circuitry are selectively configured by opening or closing the switches for operating in a mode defined by a single differential voltage mode link with a single-ended input drive.

21. The method as in claim 14, wherein said transmitter circuitry and said receiver circuitry are selectively configured by opening or closing the switches for operating in a mode defined by a single differential voltage mode link with a differential input drive.

22. The method as in claim 14, wherein said transmitter circuitry and said receiver circuitry are selectively configured by opening or closing the switches for operating in a mode defined by a single differential current mode link with a single-ended input drive mode.

23. The method as in claim 14, wherein said transmitter circuitry and said receiver circuitry are selectively configured by opening or closing the switches for operating in a mode defined by single differential current mode link with a differential input drive.

24. The method as in claim 14, wherein said transmitter circuitry and said receiver circuitry are selectively configured by opening or closing said switches for operating in one of said plurality of double single-ended, complementary metal-oxide-semiconductor voltage level link modes, or in said differential voltage or current mode links, and wherein the integrated circuits at each end of the link may operate with different supply voltages.

25. The method as in claim 14, wherein certain switches are provided to convert said input/output circuitry into either said transmitter circuitry configuration or into said receiver circuitry configuration.

26. The method as in claim 14, where in the single differential current mode a current drawn from said at least one of transmitter circuitry or receiver circuitry is constant.

27. An apparatus comprising:
a plurality of integrated circuits and at least one multi-mode Input/Output circuit configured to cause the apparatus at least to send and receive data between at least two integrated circuits, where each of the at least two integrated circuits contains at least one of said input/output circuits, comprising at least one of transmitter circuitry or receiver circuitry, said transmitter circuitry configured to send data to another integrated circuit, and said receiver circuitry configured to receive data from another integrated circuit, said input/output circuit being constructed with complementary metal-oxide-semiconductor based transistors that are selectively interconnected together by switches to operate as two single-ended, current or voltage mode links, and as a single differential current or voltage mode link.

28. The apparatus as in claim 27, where said transmitter circuitry sends data to receiver circuitry in another integrated circuit over a first conductor of a pair of adjacently disposed conductors, and where said receiver circuitry receives data from transmitter circuitry in said another integrated circuit over a second conductor of the pair of adjacently disposed conductors.

29. The apparatus as in claim 27, where said transmitter circuitry and said receiver circuitry are selectively configured by opening or closing switches for operating under a condition where a power supply voltage of said transmitter circuitry is equal to a power supply voltage of receiver circuitry in another integrated circuit, for operating under a condition where the power supply voltage of said transmitter circuitry is less than the power supply voltage of receiver circuitry in another integrated circuit, and for operating under a condition where the power supply voltage of said transmitter circuitry is greater than the power supply voltage of receiver circuitry in another integrated circuit.

30. The apparatus as in claim 27, where said transmitter circuitry and said receiver circuitry are selectively configured by opening or closing switches for operating in one of a plurality of double single-ended, complementary metal-oxide-semiconductor voltage level link modes, wherein in a first mode a power supply voltage of said transmitter circuitry is equal to a power supply voltage of receiver circuitry in another integrated circuit, wherein in a second mode the power supply voltage of said transmitter circuitry is less than the power supply voltage of receiver circuitry in another integrated circuit, and wherein in a third mode the power supply voltage of said transmitter circuitry is greater than the power supply voltage of receiver circuitry in another integrated circuit.

31. The apparatus as in claim 27, where said transmitter circuitry and said receiver circuitry are selectively configured by opening or closing switches for operating in one of said plurality of double single-ended, complementary metal-oxide-semiconductor voltage level link modes, or in said differential voltage or current mode links, and wherein the integrated circuits at each end of the link may operate with different supply voltages.

32. The apparatus as in claim 27, where said transmitter circuitry and said receiver circuitry are selectively configured by opening or closing switches for operating in a double single-ended voltage mode link mode.

33. The apparatus as in claim 27, where said transmitter circuitry and said receiver circuitry are selectively configured by opening or closing switches for operating in a double single-ended current mode link mode.

34. The apparatus as in claim 27, where said transmitter circuitry and said receiver circuitry are selectively configured by opening or closing switches for operating in a mode defined by a single differential voltage mode link with a single-ended input drive.

35. The apparatus as in claim 27, where said transmitter circuitry and said receiver circuitry are selectively configured by opening or closing switches for operating in a mode defined by a single differential voltage mode link with a differential input drive.

36. The apparatus as in claim 27, where said transmitter circuitry and said receiver circuitry are selectively configured by opening or closing switches for operating in a mode defined by a single differential current mode link with a single-ended input drive mode.

37. The apparatus as in claim 27, where said transmitter circuitry and said receiver circuitry are selectively configured by opening or closing switches for operating in a mode defined by single differential current mode link with a differential input drive.

38. The apparatus as in claim 27, where certain switches are provided to convert said input/output circuitry into either said transmitter circuitry configuration or into said receiver circuitry configuration.

39. The apparatus as in claim 27, where at least one of said plurality of integrated circuits comprises a radio frequency integrated circuit, and where at least one other one of said integrated circuits comprises a baseband integrated circuit.

40. The apparatus as in claim 27, where in the single differential current mode a current drawn from said at least one of transmitter circuitry or receiver circuitry is constant.

\* \* \* \* \*